(12) United States Patent
Kim

(10) Patent No.: US 8,372,732 B2
(45) Date of Patent: Feb. 12, 2013

(54) METHOD FOR FABRICATING NON-VOLATILE MEMORY DEVICE

(75) Inventor: In-Hoe Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/279,072

(22) Filed: Oct. 21, 2011

(65) Prior Publication Data

US 2012/0100700 A1    Apr. 26, 2012

(30) Foreign Application Priority Data

Oct. 22, 2010  (KR) ......................... 10-2010-0103409

(51) Int. Cl.
*H01L 21/28*    (2006.01)
(52) U.S. Cl. ........ 438/478; 438/253; 438/653; 438/268; 438/240; 438/262; 257/401; 257/E21.21; 257/296
(58) Field of Classification Search .................. 257/401, 257/288, 296, E21.21, E27.06; 438/478, 438/285, 488
See application file for complete search history.

(56) References Cited

U.S. PATENT DOCUMENTS

| | | | |
|---|---|---|---|
| 6,720,218 B2 * | 4/2004 | Jang ............................. | 438/257 |
| 6,727,539 B2 * | 4/2004 | Divakaruni et al. ........... | 257/296 |
| 6,746,915 B2 * | 6/2004 | Wu ............................... | 438/253 |
| 2010/0123202 A1 * | 5/2010 | Hofmann ...................... | 257/401 |
| 2010/0171164 A1 * | 7/2010 | Ozawa et al. .................. | 257/315 |
| 2011/0062510 A1 * | 3/2011 | Joo ................................ | 257/324 |
| 2011/0073866 A1 * | 3/2011 | Kim et al. ....................... | 257/69 |
| 2011/0090737 A1 * | 4/2011 | Yoo et al. ................... | 365/185.11 |
| 2011/0199813 A1 * | 8/2011 | Yoo et al. ..................... | 365/148 |
| 2011/0291177 A1 * | 12/2011 | Lee et al. ...................... | 257/324 |

FOREIGN PATENT DOCUMENTS

| | | |
|---|---|---|
| KR | 10-1997-0053947 | 7/1997 |
| KR | 1020100028827 | 3/2010 |
| KR | 1020100113360 | 10/2010 |
| KR | 1020110026313 | 3/2011 |

OTHER PUBLICATIONS

Notice of Allowance issued by the Korean Intellectual Property Office on Mar. 27, 2012.

* cited by examiner

*Primary Examiner* — Thao Le
*Assistant Examiner* — Sheng Zhu
(74) *Attorney, Agent, or Firm* — IP & T Group LLP

(57) ABSTRACT

A method for fabricating a non-volatile memory device includes repeatedly stacking interlayer dielectric layers and gate conductive layers on a substrate; etching the interlayer dielectric layers and the gate conductive layers to form cell channel holes that expose the substrate, forming a protective layer along a resultant structure, forming a capping layer on the protective layer to fill the cell channel holes, planarizing the protective layer and the capping layer until an uppermost one of the interlayer dielectric layers is exposed, forming a gate conductive layer for select transistors and an interlayer dielectric layer for select transistors on a resultant structure, etching the interlayer dielectric layer and the gate conductive layer, to form select transistor channel holes that expose the capping layer while removing the capping layer buried in the cell channel holes, and removing the protective layer.

19 Claims, 10 Drawing Sheets

METHOD FOR FABRICATING NON-VOLATILE MEMORY DEVICE

CROSS-REFERENCE TO RELATED APPLICATIONS

The present application claims priority of Korean Patent Application No. 10-2010-0103409, filed on Oct. 22, 2010, which is incorporated herein by reference in its entirety.

BACKGROUND

1. Field

Exemplary embodiments of the present invention relate to a semiconductor fabrication technology, and more particularly, to a method for fabricating a non-volatile memory device with a three-dimensional structure.

2. Description of the Related Art

A non-volatile memory device refers to a memory device in which stored data is retained even if a supply power is cut off. As an increase in the degree of integration of a two-dimensional memory device in which memory cells are formed as a single layer on a silicon substrate is reaching physical limits, a three-dimensional non-volatile memory device in which memory cells are vertically stacked from a silicon substrate is being developed.

The three-dimensional non-volatile memory device has a structure in which a lower select transistor, a cell transistor region, and an upper select transistor are stacked from the silicon substrate.

Since the lower select transistor, the cell transistor region, and the upper select transistor are formed through respective processes and channel formation processes are also performed through respective processes, a fabrication process may be complicated.

In this regard, a method for stably fabricating a non-volatile memory device with a three-dimensional structure through a simplified process may be useful.

SUMMARY

An embodiment of the present invention is directed to a method for fabricating a non-volatile memory device, which is capable of simultaneously forming memory cells and channel regions of select transistors.

Another embodiment of the present invention is directed to a method for fabricating a non-volatile memory device, which is capable of protecting a memory cell region already opened at the time of channel formation.

In accordance with an embodiment of the present invention, a method for fabricating a non-volatile memory device includes: stacking interlayer dielectric layers and gate conductive layers for memory cells on a substrate; etching the interlayer dielectric layers and the gate conductive layers for memory cells to form cell channel holes that expose the substrate; forming a protective layer along a surface of a resultant structure including the cell channel holes; forming a capping layer on the protective layer to fill the cell channel holes; planarizing the protective layer and the capping layer until an uppermost one of the interlayer dielectric layers for memory cells is exposed; forming a gate conductive layer for select transistors and an interlayer dielectric layer for select transistors on a resultant structure including the exposed uppermost interlayer dielectric layer after the planarizing of the protective layer and the capping layer; etching the interlayer dielectric layer for select transistors and the gate conductive layer for select transistors to form select transistor channel holes that expose the capping layer while the capping layer buried in the cell channel holes is removed; and removing the protective layer.

In accordance with another embodiment of the present invention, a method for fabricating a non-volatile memory device includes: forming pipe channel holes, in which a sacrificial layer is buried, in a substrate; stacking interlayer dielectric layers and gate conductive layers for memory cells on the substrate including the sacrificial layer; etching the interlayer dielectric layers for memory cells and the gate conductive layers for memory cells to form a pair of cell channel holes that expose the sacrificial layer; forming a protective layer along a surface of a resultant structure including the cell channel holes after the etching of the interlayer dielectric layers and the gate conductive layers; forming a capping layer on the protective layer to fill the cell channel holes; planarizing the protective layer and the capping layer until an uppermost one of the interlayer dielectric layers for memory cells is exposed; forming a gate conductive layer for select transistors and an interlayer dielectric layer for select transistors on a resultant structure including the interlayer dielectric layers for memory cells and the capping layer after the planarizing of the protective layer and the capping layer; etching the interlayer dielectric layer for select transistors and the gate conductive layer for select transistors to form select transistor channel holes that expose the capping layer while the capping layer buried in the cell channel holes is removed; and removing the protective layer and the sacrificial layer.

In accordance with yet another embodiment of the present invention, a method for fabricating a non-volatile memory device includes: etching alternately stacked interlayer dielectric layers and gate conductive layers for memory cells to form channel holes for memory cells; forming a protective layer on the channel holes for memory cells; filling the channel holes for memory cells with a capping layer; forming a gate conductive layer and an interlayer dielectric layer for select transistors on a structure including the protective layer and the capping layer; etching the gate conductive layer and the interlayer dielectric layer for select transistors to form channel holes for select transistors that expose the capping layer while removing the capping layer buried in the channel holes for memory cells without removing the protective layer; removing the protective layer after the etching of the gate conductive layer and the interlayer dielectric layer for select transistors; and lining the channel holes for memory cells and the channel holes for select transistors with a memory layer after the removing of the protective layer.

DETAILED DESCRIPTION

Figure 1A:
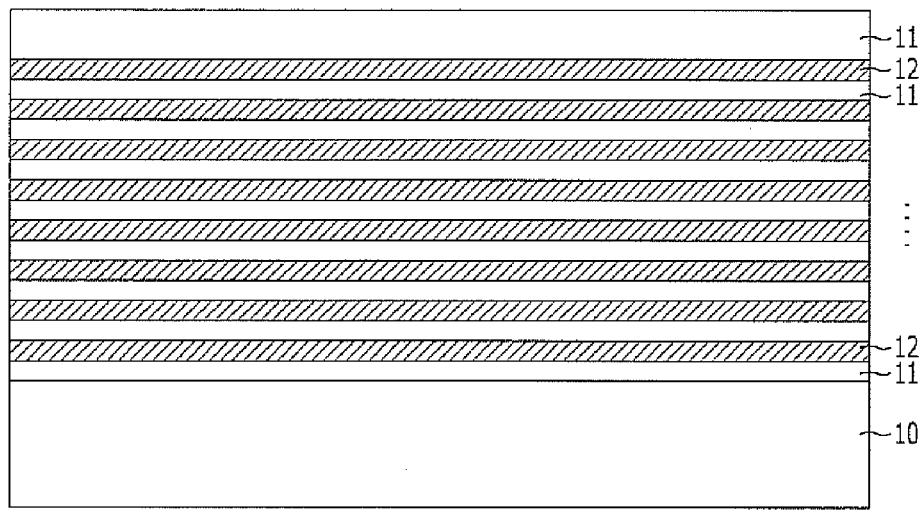
FIGS. 1A and 1I are cross-sectional views illustrating a method for fabricating a non-volatile memory device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

First Embodiment

Figure 1B:
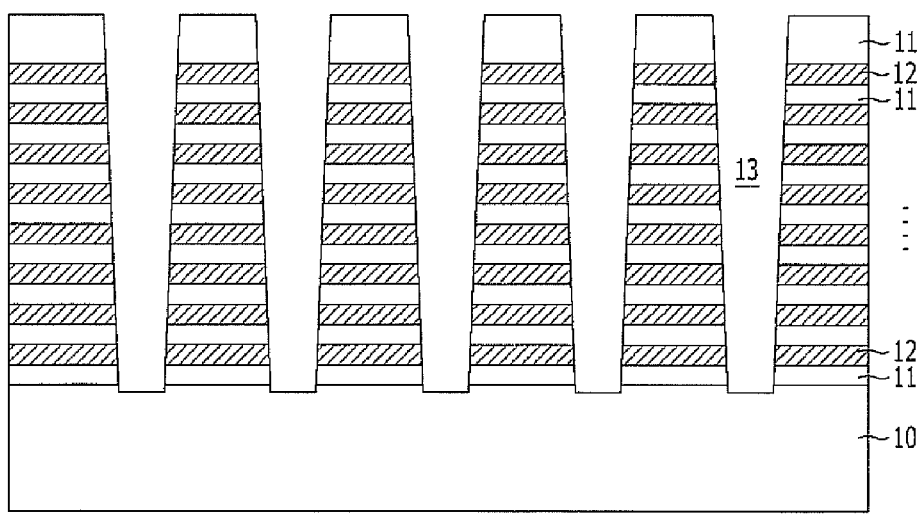
Figure 1C:
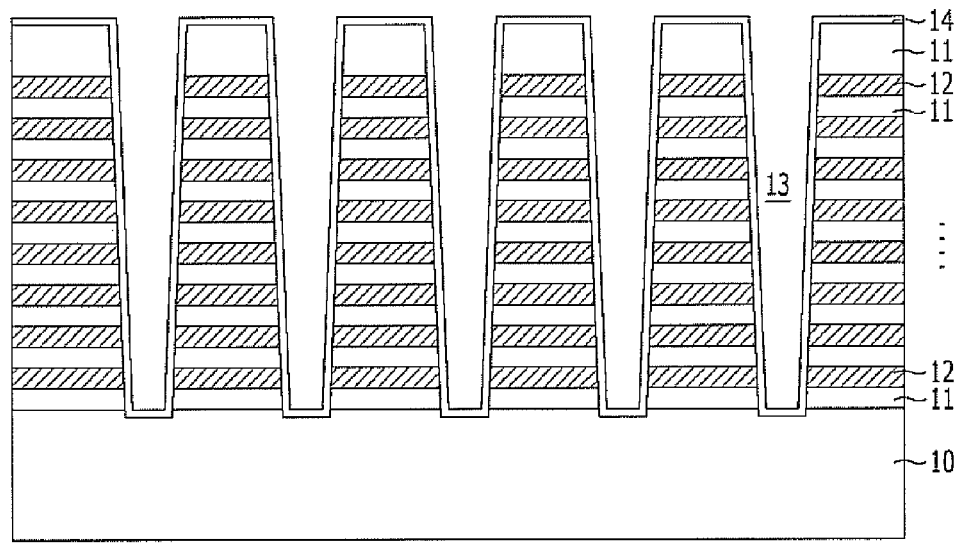
Figure 1D:
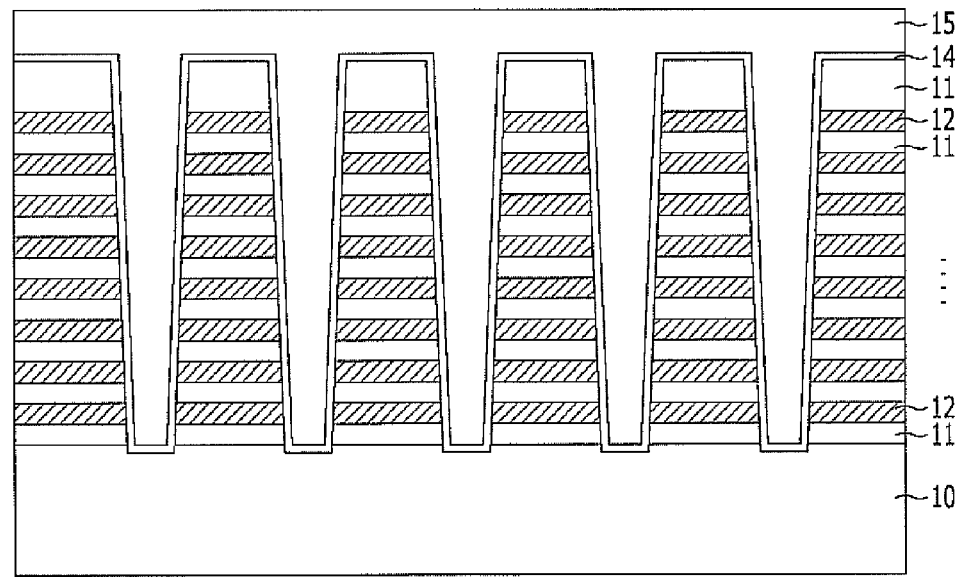
Figure 1E:
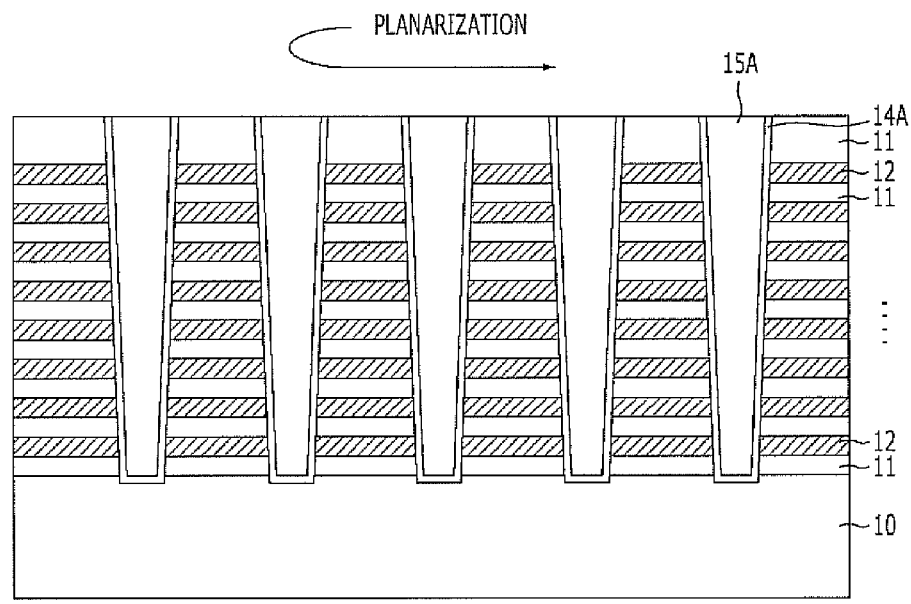
Figure 1F:
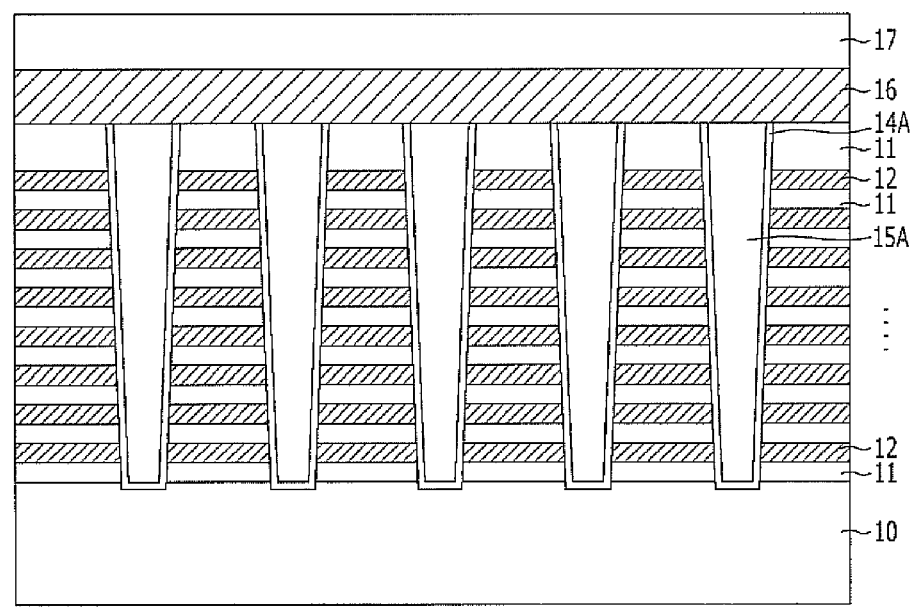
Figure 1G:
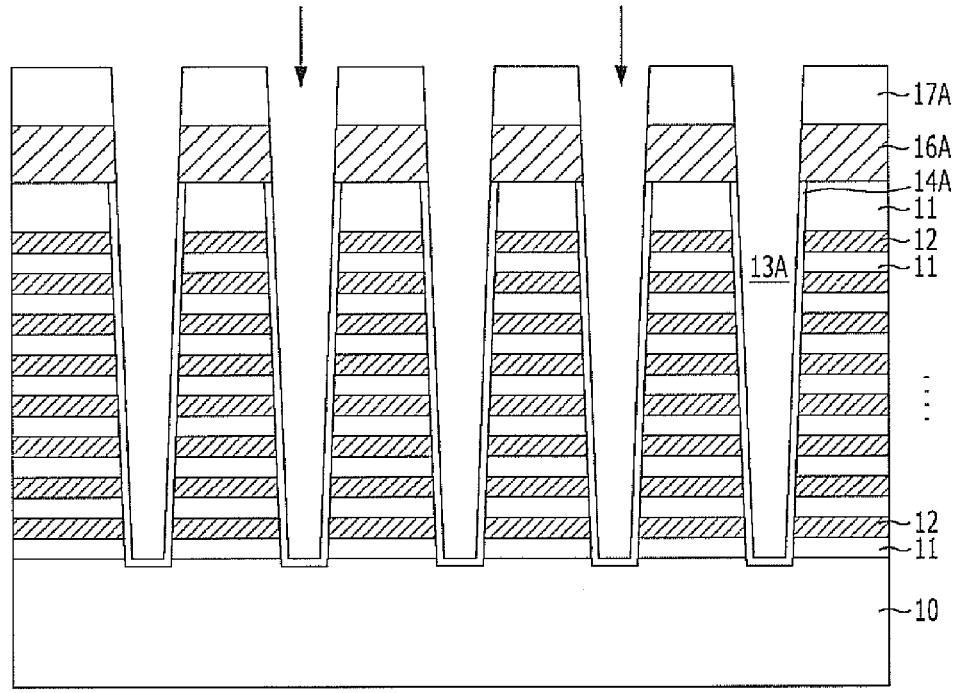
Figure 1H:
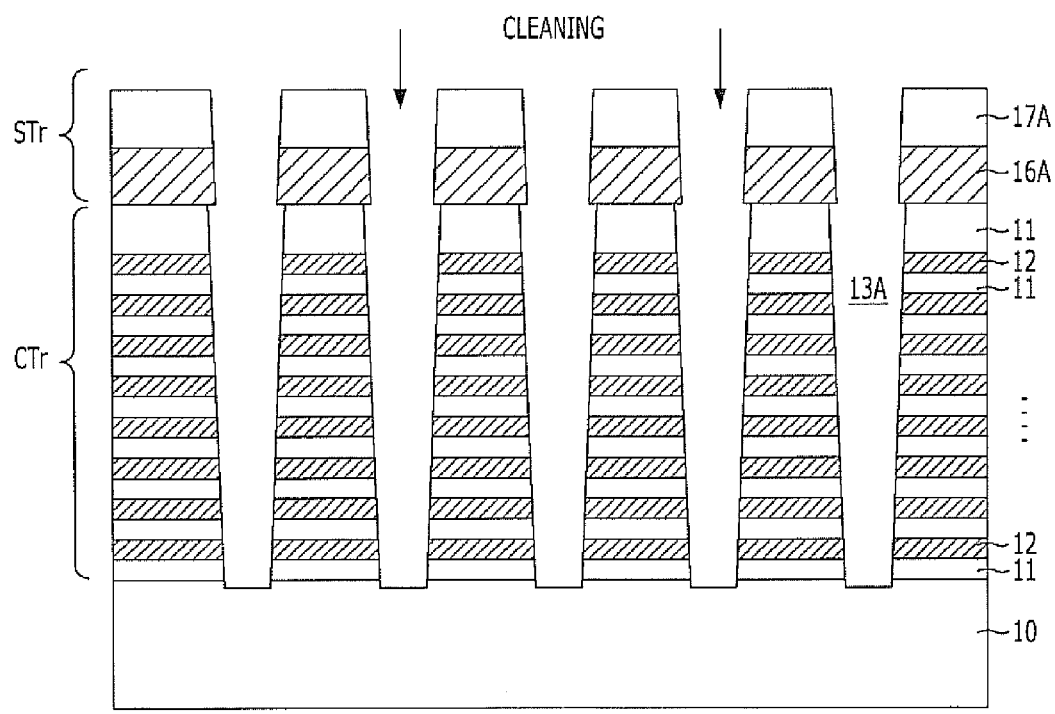
Figure 1I:
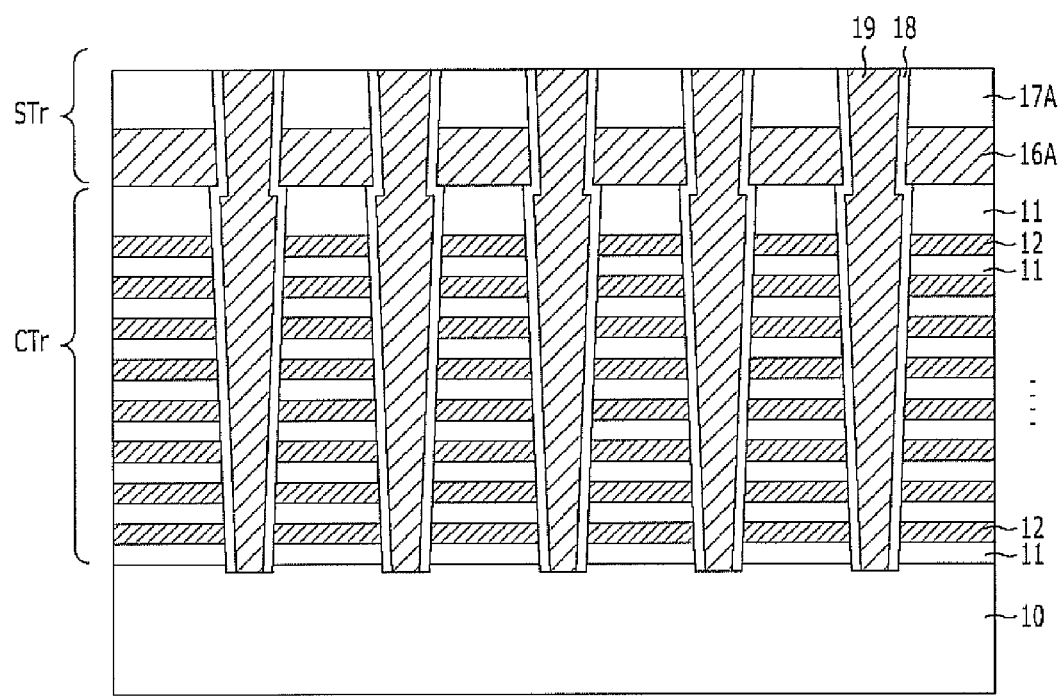

FIGS. 1A and 1I are cross-sectional views illustrating a method for fabricating a non-volatile memory device in accordance with an embodiment of the present invention.

Referring to FIG. 1A, interlayer dielectric layers 11 and gate conductive layers 12 for memory cells are repeatedly stacked on a substrate 10.

The substrate 10 includes a substrate in which a lower structure such as a source line and a lower select transistor has been formed, and the interlayer dielectric layers 11 for memory cells separate a plurality of stacked memory cells from one another. The interlayer dielectric layers 11 each include an oxide layer or a low-k oxide layer, and the gate conductive layers 12 each includes a polysilicon layer.

The number of repetitions of the interlayer dielectric layers 11 and the gate conductive layers 12 for memory cells may be adjusted according to the number of memory cells to be stacked from the substrate 10. In memory strings, 4, 8, and 16 memory cells may be stacked, respectively. Thus, one memory cell string including two memory strings may include 8, 16 or 32 memory cells.

After the stack process, the interlayer dielectric layer 11 for memory cells is stacked on the uppermost layer to provide insulation with respect to a subsequent select transistor.

Referring to FIG. 1B, the interlayer dielectric layers 11 and the gate conductive layers 12 for memory cells are etched to form cell channel holes 13 that expose the substrate 10.

Referring to FIG. 1C, a protective layer 14 is formed on a resultant structure including the cell channel holes 13. The protective layer 14 protects the interlayer dielectric layer 11 for memory cells when subsequently forming channel holes for upper select transistors.

To this end, the protective layer 14 may be formed of a material with etching selectivity relative to the interlayer dielectric layers 11. When the interlayer dielectric layer 11 for memory cells is an oxide layer, the protective layer 14 is formed of a nitride layer or an amorphous carbon layer.

The protective layer 14 is formed using a chemical vapor deposition (CVD) method or an atomic layer deposition (ALD) method. Specifically, the protective layer 14 may be deposited as a liner in order to minimize the damage of the interlayer dielectric layers 11 for memory cells during a subsequent removal process.

Referring to FIG. 1D, a capping layer 15 is formed on the protective layer 14 to fill the cell channel holes 13. The capping layer 15 is formed of a material with etching selectivity relative to the protective layer 14 and a material which can be easily removed when subsequently forming the upper select transistor channel holes.

The capping layer 15, for example, is formed of an oxide layer. The oxide layer includes one selected from the group consisting of a plasma enhanced tetra ethyl ortho silicate glass (PETEOS) layer, an $O_3$ TEOS layer, a high density plasma (HDP) layer, a spin-on dielectric (SOD) layer, and a boron phosphorus silicate glass (BPSG) layer. The oxide layer may be formed using the chemical vapor deposition method or the atomic layer deposition method.

Referring to FIG. 1E, the capping layer 15 and the protective layer 14 are planarized until the uppermost interlayer dielectric layer 11 for memory cells is exposed. The planarization process of the capping layer 15 and the protective layer 14 may be performed using a chemical mechanical polishing (CMP) process or an etch-back process.

The uppermost interlayer dielectric layer 11 for memory cells is exposed through the planarization process, and the capping layer 15 and the protective layer 14 exist, for example, only in the cell channel holes 13. Hereinafter, the capping layer 15 and the protective layer 14 remaining in the cell channel holes 13 will be referred to as a 'capping layer 15A' and a 'protective layer 14A', respectively.

Referring to FIG. 1F, gate conductive layers 16 for select transistors and an interlayer dielectric layer 17 are stacked on a resultant structure including the uppermost interlayer dielectric layer 11 for memory cells. The gate conductive layers 16 for select transistors each include a polysilicon layer and the interlayer dielectric layers 17 each include an oxide layer or a low-k oxide layer.

Referring to FIG. 1G, the interlayer dielectric layers 17 and the gate conductive layers 16 for select transistors are etched, thereby forming the select transistor channel holes while removing the capping layer 15A (refer to FIG. 1F) buried in the cell channel holes 13 (refer to FIG. 1F).

Since the capping layer 15A includes an oxide layer, the capping layer 15A can be easily removed when etching the interlayer dielectric layers 17 and the gate conductive layers 16 for select transistors. Furthermore, since the protective layer 14A remains when removing the capping layer 15A (refer to FIG. 1F), the interlayer dielectric layer 11 for memory cells may be prevented from being damaged.

Hereinafter, the cell channel holes and the select transistor channel holes will be referred to as channel regions 13A.

Referring to FIG. 1H, the protective layer 14A (refer to FIG. 1G) is removed. The protective layer 14A (refer to FIG. 1G) is removed using a cleaning process including a dry cleaning process or a wet cleaning process.

Since the protective layer 14A (refer to FIG. 1G) is formed of a material (that is, a nitride layer or an amorphous carbon layer) with etching selectivity relative to the interlayer dielectric layer 11 for memory cells and the gate conductive layer 12 for memory cells, the interlayer dielectric layer 11, the gate conductive layer 12 for memory cells, the gate conductive layer 16 for select transistors, and the interlayer dielectric layer 17 from being damaged while removing the protective layer 14A (refer to FIG. 1G).

Moreover, since a cleaning process time for removing the protective layer 14A (refer to FIG. 1G) formed as a liner is not long, the interlayer dielectric layer 11 for memory cells, the gate conductive layer 12 for memory cells, the gate conductive layer 16 for select transistors, and the interlayer dielectric layer 17 for select transistors may be further prevented from being damaged.

Referring to FIG. 1I, a memory layer 18 is formed on sidewalls of the channel regions 13A. The memory layer 18, for example, may be formed of an oxide/nitride/oxide (ONO) layer.

A polysilicon layer is filled in the channel regions 13A to form channels 19.

Thus, the interlayer dielectric layer 11 for memory cells and the gate conductive layer 12 for memory cells, which have been repeatedly stacked, form memory cells CTr, and the gate conductive layer 16 for select transistors and the interlayer dielectric layer 17 form upper select transistors STr.

The memory layer 18 has different functions in the memory cells CTr and the upper select transistors STr. More specifically, in the memory layer 18 in the memory cells CTr, the memory layer (ONO layer) serves as a charge blocking layer, a charge trap layer, and a tunnel insulation layer. Since the memory cells CTr have an operating voltage of 12 V to 20 V, charge is trapped in the memory layer 18.

Furthermore, the memory layer 18 in the upper select transistors STr serves as an insulation layer for insulating the channels 19 from the upper select transistors STr. The upper select transistors STr have an operating voltage of 0 V to 2 V. Since charge is not trapped in the ONO layer in the same voltage range, the memory layer 18 serves as an insulation layer that allows an on/off operation of a transistor to be performed and does not trap charges.

As described above, since the cell channel holes and the select is transistor channel holes are simultaneously opened as the channel regions 13A, a process margin may be ensured by forming the memory layer 18 and the channels 19 in the memory cells and the upper select transistors at a time.

Second Embodiment

Figure 2A:
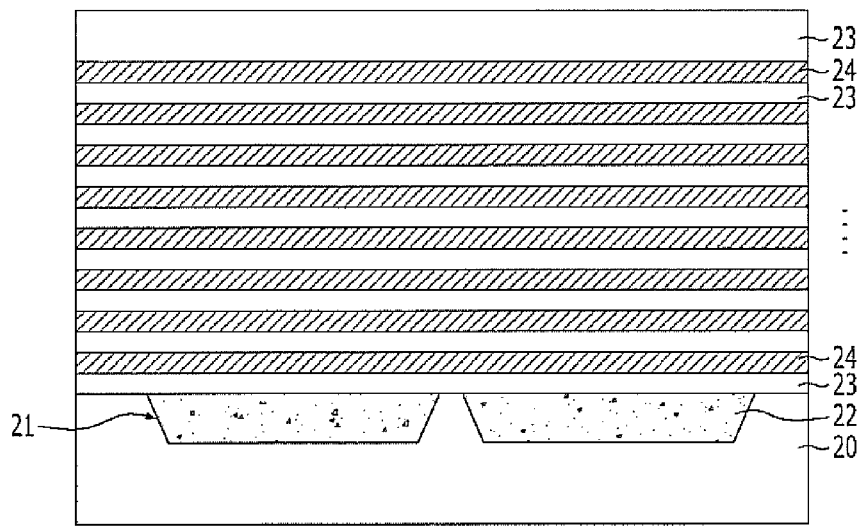
FIGS. 2A and 2I are cross-sectional views illustrating a method for fabricating a non-volatile memory device in accordance with a second embodiment of the present invention.
Figure 2B:
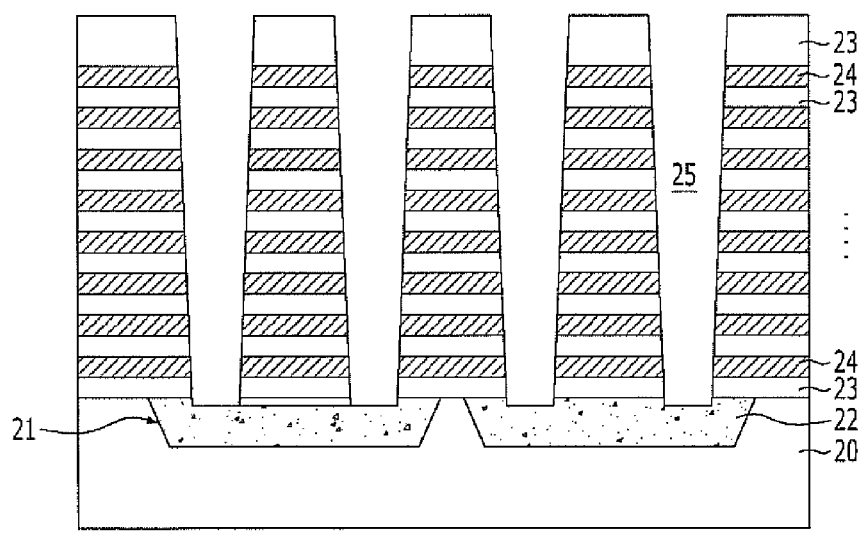
Figure 2C:
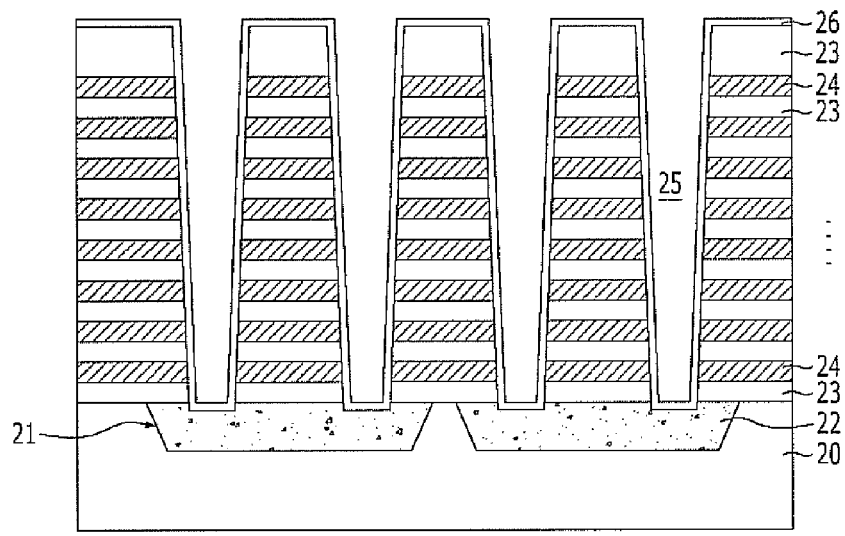
Figure 2D:
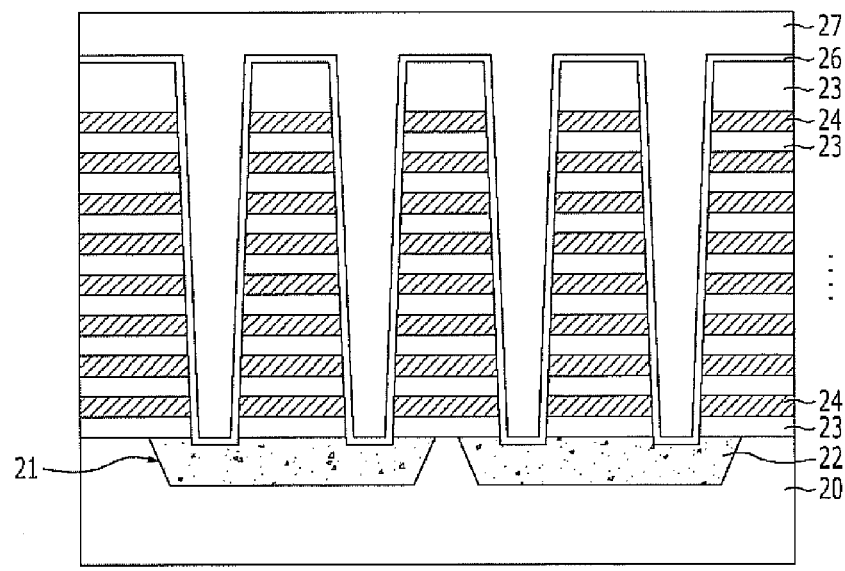
Figure 2E:
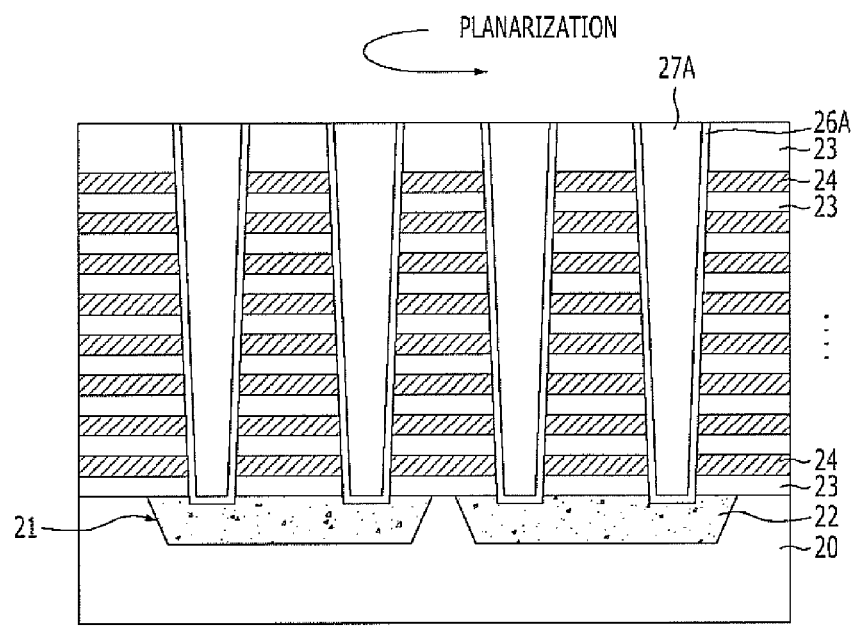
Figure 2F:
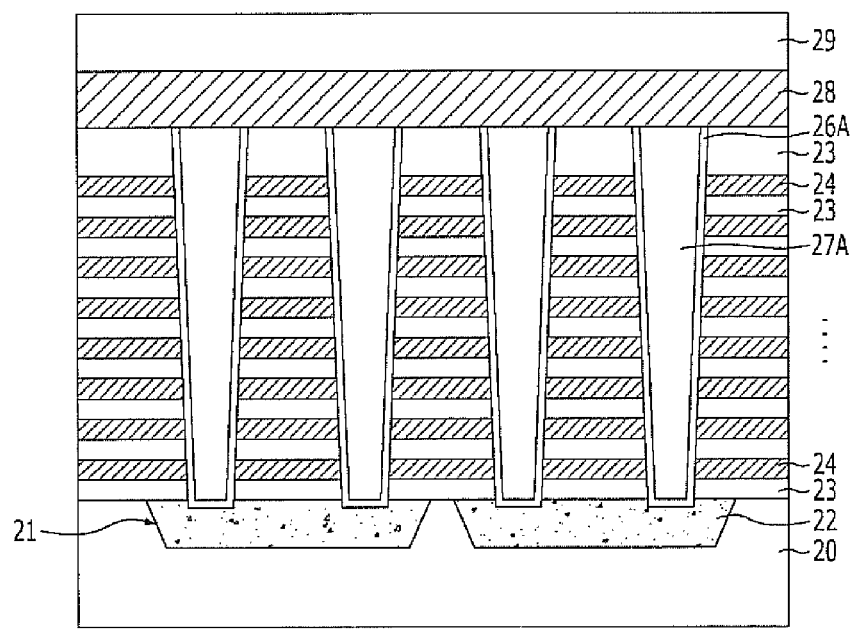
Figure 2G:
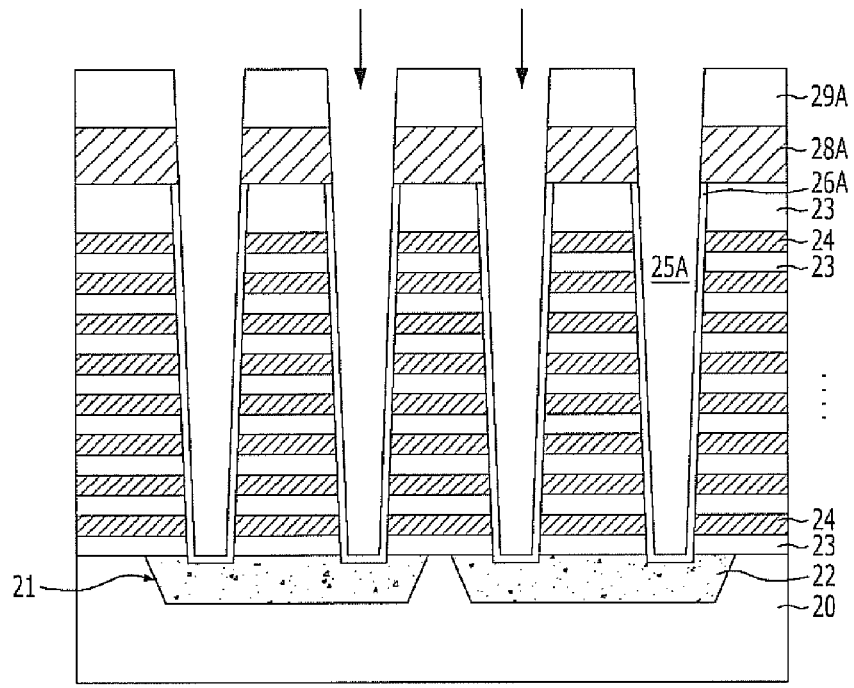
Figure 2H:
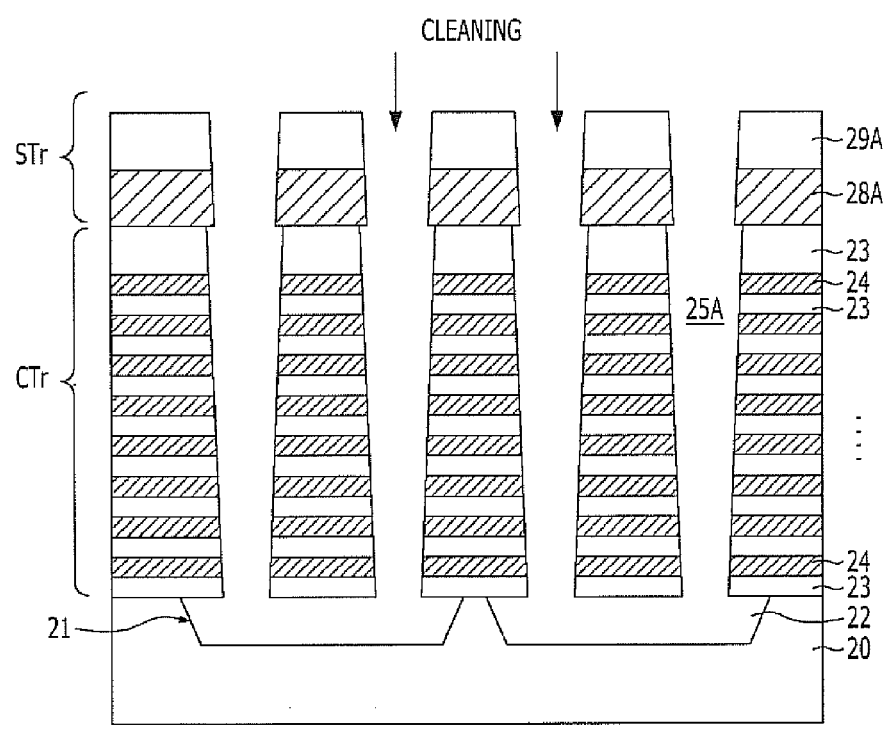
Figure 2I:
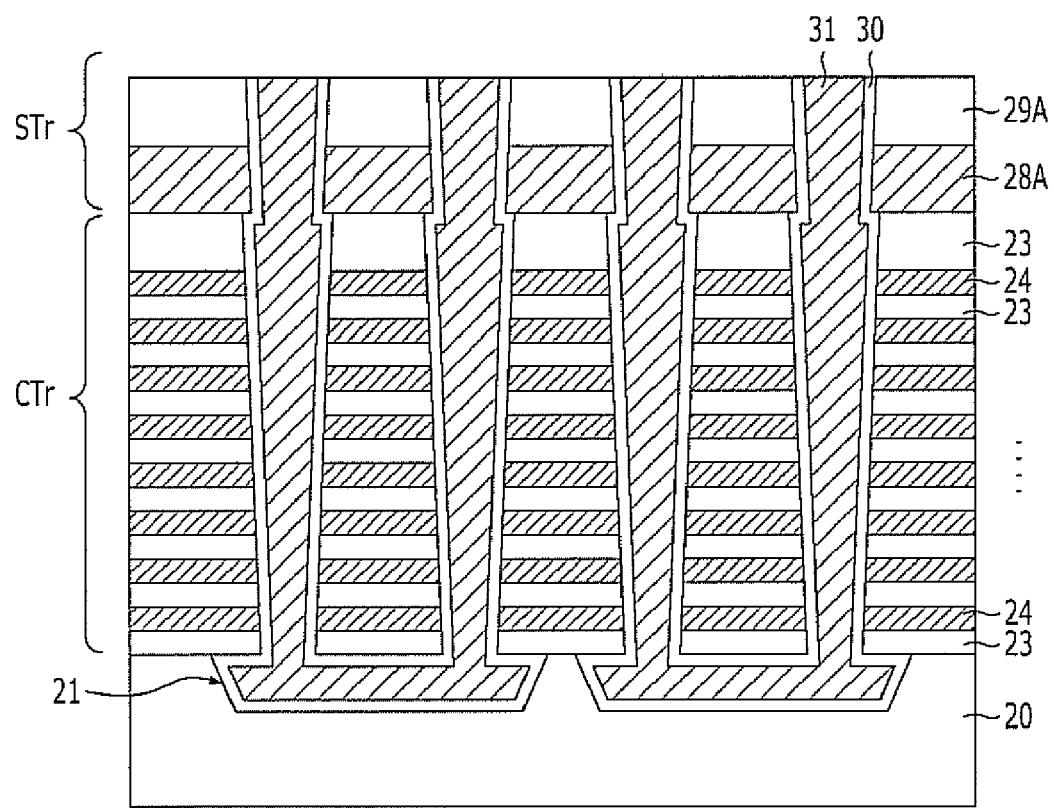

FIGS. 2A and 2I are cross-sectional views illustrating a method for fabricating a non-volatile memory device in accordance with an embodiment of the present invention.

Referring to FIG. 2A, a substrate 20 is partially etched to form pipe channel holes 21. The substrate 20 includes a part to be used as a pipe gate.

A sacrificial layer 22 is formed to gap-fill the pipe channel holes 21. The sacrificial layer 22 includes an insulation layer, and specifically, includes a nitride layer. The sacrificial layer 22 is formed on an entire surface until the pipe channel holes 21 are gap-filled, and a planarization process is performed until the surface of the substrate 20 is exposed. The planarization process, for example, includes a chemical mechanical polishing (CMP) process or an etch-back process.

Interlayer dielectric layers 23 and gate conductive layers 24 for memory cells are repeatedly stacked on the substrate 20 including the sacrificial layer 22.

The interlayer dielectric layers 23 separate a plurality of stacked memory cells from one another. The interlayer dielectric layers 23 each include an oxide layer or a low-k oxide layer, and the gate conductive layers 24 for memory cells each include a polysilicon layer.

The number of repetitions of the interlayer dielectric layers 23 and the gate conductive layers 24 for memory cells may be adjusted according to the number of memory cells to be stacked from the substrate 20. In each memory string, 4, 8, and 16 memory cells may be stacked, respectively. Thus, one memory cell string including two memory strings may include 8, 16 or 32 memory cells.

After the stack process, the interlayer dielectric layer 23 is stacked on the uppermost layer in order to provide insulation with respect to a subsequent select transistor.

Referring to FIG. 2B, the interlayer dielectric layers 23 and the gate conductive layers 24 for memory cells are etched to form cell channel holes 25 that expose the surface of the sacrificial layer 22. The cell channel holes 25 are formed through the interlayer dielectric layers 23 and the gate conductive layer 24 for memory cells, which are repeatedly stacked, and a pair of cell channel holes 25 may be positioned in one sacrificial layer 22, that is, one pipe channel hole 21.

Referring to FIG. 2C, a protective layer 26 is formed on a resultant structure including the cell channel holes 25. The protective layer 26 protects the interlayer dielectric layer 23 while channel holes for upper select transistors are subsequently formed.

To this end, the protective layer 26 may be formed of a material with etching selectivity relative to the interlayer dielectric layer 23 for memory cells. When the interlayer dielectric layer 23 for memory cells is an oxide layer, the protective layer 26 is formed of a nitride layer or an amorphous carbon layer.

The protective layer 26 is formed using a chemical vapor deposition (CVD) method or an atomic layer deposition (ALD) method. Specifically, the protective layer 26 may be deposited in a liner shape in order to minimize the damage of the interlayer dielectric layer 23 for memory cells during a subsequent removal process.

Referring to FIG. 2D, a capping layer 27 is formed on the protective layer 26 to fill the cell channel holes 25. The capping layer 27 is formed of a material with etching selectivity relative to the protective layer 26 and a material which can be easily removed when subsequently forming the upper select transistor channel holes.

The capping layer 27, for example, is formed of an oxide layer. The oxide layer includes one selected from the group consisting of a plasma enhanced tetra ethyl ortho silicate glass (PETEOS) layer, an $O_3$ TEOS layer, a high density plasma (HDP) layer, a spin-on dielectric (SOD) layer, and a boron phosphorus silicate glass (BPSG) layer. The oxide layer may be formed using the chemical vapor deposition method or the atomic layer deposition method.

Referring to FIG. 2E, the capping layer 27 (referring to FIG. 2D) and the protective layer 26 (referring to FIG. 2D) are planarized until the uppermost interlayer dielectric layer 23 for memory cells is exposed. The planarization process of the capping layer 27 and the protective layer 26 may be performed using a chemical mechanical polishing (CMP) process or an etch-back process.

The uppermost interlayer dielectric layer 23 for memory cells is exposed through the planarization process, and the capping layer 27 (referring to FIG. 2D) and the protective layer 26 (referring to FIG. 2D) exist, for example, only in the cell channel holes 25. Hereinafter, the capping layer 27 and the protective layer 26 remaining in the cell channel holes 25 will be referred to as a 'capping layer 27A' and a 'protective layer 26A', respectively.

Referring to FIG. 2F, gate conductive layers 28 for select transistors and interlayer dielectric layers 29 are stacked on a resultant structure including the uppermost interlayer dielectric layer 23 for memory cells. The gate conductive layers 28 for select transistors include a polysilicon layer and the interlayer dielectric layers 29 include an oxide layer or a low-k oxide layer.

Referring to FIG. 2G, the interlayer dielectric layers 29 and the gate conductive layer 28 for select transistors are etched, thereby forming the select transistor channel holes while removing the capping layer 27A (refer to FIG. 2F) buried in the cell channel holes 25 (refer to FIG. 2F).

Since the capping layer 27A (refer to FIG. 2F) includes an oxide layer, the capping layer 27A can be easily removed when etching the interlayer dielectric layer 29 for select transistors and the gate conductive layer 28 for select transistors. Furthermore, since the protective layer 26A remains when removing the capping layer 27A (refer to FIG. 2F), the interlayer dielectric layers 23 may be prevented from being damaged.

Hereinafter, the cell channel holes and the select transistor channel holes will be referred to as channel regions 25A.

Referring to FIG. 2H, the protective layer 26A (refer to FIG. 2G) is removed. The protective layer 26A (refer to FIG. 2G) is removed using a cleaning process including a dry cleaning process or a wet cleaning process.

Since the protective layer 26A (refer to FIG. 2G) is formed of a material (that is, a nitride layer or an amorphous carbon layer) with etching selectivity relative to the interlayer dielectric layers 23 and the gate conductive layers 24 for memory cells, the interlayer dielectric layer 23, the gate conductive layer 24 for memory cells, the gate conductive layer 28 for select transistors, and the interlayer dielectric layer 29 for select transistors may be prevented from being damaged when removing the protective layer 26A (refer to FIG. 2G).

Moreover, since a cleaning process time for removing the protective layer 26A (refer to FIG. 2G) in the form of a liner is not long, the interlayer dielectric layer 23, the gate conductive layer 24 for memory cells, the gate conductive layer 28 for select transistors, and the interlayer dielectric layer 29 for select transistors may be prevented from being damaged.

The sacrificial layer 22 is removed to open the pipe channel holes 21.

Referring to FIG. 2I, a memory layer 30 is formed in the pipe channel holes 21 and on sidewalls of the channel regions 25A. The memory layer 30, for example, may be formed of an oxide/nitride/oxide (ONO) layer.

A polysilicon layer is filled in the pipe channel holes 21 and the channel regions 25A to form channels 31.

Thus, the interlayer dielectric layers 23 and the gate conductive layer 24 for memory cells, which have been repeatedly stacked, form memory cells CTr, and the gate conductive layer 28 for select transistors and the interlayer dielectric layer 29 form upper select transistors STr.

The memory layer 30 has different functions in the memory cells CTr and the upper select transistors STr. More specifically, in the memory layer 30 in the memory cells CTr, the ONO layer serves as a charge blocking layer, a charge trap layer, and a tunnel insulation layer. Since the memory cells CTr have an operating voltage of 12 V to 20 V, charge is trapped in the memory layer 30.

Furthermore, the memory layer 30 in the upper select transistors STr serves as an insulation layer for insulating the channels 31 from the upper select transistors STr. The upper select transistors STr have an operating voltage of 0 V to 2. Since charge is not trapped in the ONO layer in the same voltage range, the memory layer 30 serves as an insulation layer that allows an on/off operation of a transistor to be performed and does not trap charge.

As described above, since the cell channel holes and the select transistor channel holes are simultaneously opened as the channel regions 25A, a process margin may be obtained by forming the memory layer 30 and the channels 31 in the memory cells and the upper select transistors at a time.

In the method for fabricating the non-volatile memory device in accordance with the embodiment of the present invention as described above, cell channel holes are formed and then a protective layer and a capping layer are formed, so that interlayer dielectric layers for memory cells may be prevented from being damaged when forming select transistor channel holes.

Specifically, the protective layer is provided as a liner and is formed of a material with etching selectivity relative to the interlayer dielectric layer for memory cells and the capping layer, so that the interlayer dielectric layers for memory cells may be prevented from being damaged.

Furthermore, a memory layer and channels of memory cells and upper select transistors are formed at a time, so that a process margin may be obtained.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a non-volatile memory device, comprising: alternatively stacking a plurality of interlayer dielectric layers and a plurality of gate conductive layers for memory cells on a substrate; etching the interlayer dielectric layers and the gate conductive layers for memory cells to form cell channel holes that expose the substrate; forming a protective layer along a surface of a resultant structure including the cell channel holes; forming a capping layer on the protective layer to fill the cell channel holes; planarizing the protective layer and the capping layer until an uppermost one of the interlayer dielectric layers for memory cells is exposed; forming a gate conductive layer for select transistors and an interlayer dielectric layer for select transistors on a resultant structure including the exposed uppermost interlayer dielectric layer after the planarizing of the protective layer and the capping layer; etching the interlayer dielectric layer for select transistors and the gate conductive layer for select transistors to form select transistor channel holes that expose the capping layer while the capping layer buried in the cell channel holes is removed; and removing the protective layer.

2. The method of claim 1, wherein the gate conductive layer for memory cells includes polysilicon.

3. The method of claim 1, wherein the interlayer dielectric layers for memory cells each include an oxide layer.

4. The method of claim 1, wherein the protective layer includes a material with etching selectivity relative to the capping layer, the interlayer dielectric layers for memory cells, and the gate conductive layers for memory cells.

5. The method of claim 1, wherein the protective layer includes a nitride layer or an amorphous carbon layer.

6. The method of claim 1, wherein the capping layer includes an oxide layer.

7. The method of claim 1, further comprising:
forming a memory layer and a channel layer on sidewalls of the cell channel holes and the select transistor channel holes after the removing of the protective layer.

8. The method of claim 7, wherein the memory layer serves as a charge blocking layer, a charge trap layer, and a tunnel insulation layer.

9. A method for fabricating a non-volatile memory device, comprising: forming a plurality of pipe channel holes, in which a sacrificial layer is buried, in a substrate; alternatively stacking a plurality of interlayer dielectric layers and a plurality of gate conductive layers for memory cells on the substrate including the sacrificial layer; etching the interlayer dielectric layers for memory cells and the gate conductive layers for memory cells to form a pair of cell channel holes that expose the sacrificial layer; forming a protective layer along a surface of a resultant structure including the cell channel holes after the etching of the interlayer dielectric layers and the gate conductive layers; forming a capping layer on the protective layer to fill the cell channel holes; planarizing the protective layer and the capping layer until an uppermost one of the interlayer dielectric layers for memory cells is exposed; forming a gate conductive layer for select transistors and an interlayer dielectric layer for select transistors on a resultant structure including the interlayer dielectric layers for memory cells and the capping layer after the planarizing of the protective layer and the capping layer; etching the interlayer dielectric layer for select transistors and the gate conductive layer for select transistors to form select transistor channel holes that expose the capping layer while the capping layer buried in the cell channel holes is removed; and removing the protective layer and the sacrificial layer.

10. The method of claim 9, wherein the sacrificial layer includes a material with etching selectivity relative to the substrate, the interlayer dielectric layer for memory cells, and the gate conductive layer for memory cells.

11. The method of claim 9, wherein the sacrificial layer includes a nitride layer.

12. The method of claim 9, wherein the gate conductive layer for memory cells includes polysilicon.

13. The method of claim 9, wherein the protective layer includes a material with etching selectivity relative to the capping layer, the interlayer dielectric layer for memory cells, and the gate conductive layer for memory cells.

14. The method of claim 9, wherein the protective layer includes a nitride layer or an amorphous carbon layer.

15. The method of claim 9, wherein the capping layer includes an oxide layer.

16. The method of claim 9, further, after the removing of the protective layer and the sacrificial layer, comprising:
    forming a memory layer and a channel layer on sidewalls of the pipe channel holes, the cell channel holes, and the select transistor channel holes.

17. The method of claim 16, wherein the memory layer serves as a charge blocking layer, a charge trap layer, and a tunnel insulation layer.

18. A method for fabricating a non-volatile memory device, comprising: alternatively stacking a plurality of interlayer dielectric layers and a plurality of gate conductive layers for memory cells on a substrate; etching the alternately stacked interlayer dielectric layers and gate conductive layers for memory cells to form channel holes for memory cells; forming a protective layer on the channel holes for memory cells; filling the channel holes for memory cells with a capping layer; forming a gate conductive layer and an interlayer dielectric layer for select transistors on a structure including the protective layer and the capping layer; etching the gate conductive layer and the interlayer dielectric layer for select transistors to form channel holes for select transistors that expose the capping layer while removing the capping layer buried in the channel holes for memory cells without removing the protective layer; removing the protective layer after the etching of the gate conductive layer and the interlayer dielectric layer for select transistors; and lining the channel holes for memory cells and the channel holes for select transistors with a memory layer after the removing of the protective layer.

19. The method of claim 18, further comprising:
    filling the channel holes for memory cells and the channel holes for select transistors with channels after the lining of the channel holes for memory cells and the channel holes for select transistors with the memory layer.

* * * * *